(12) United States Patent
Miller et al.

(10) Patent No.: US 7,459,215 B2
(45) Date of Patent: Dec. 2, 2008

(54) CARBON FIBER COMPOSITE TRANSFER MEMBER WITH REFLECTIVE SURFACES

(75) Inventors: Chris L. Miller, Landenberg, PA (US);
Daisuke Uchida, Kanawage-Ken (JP);
Takashi Kobayashi, Kanagawa-Ken (JP); Kenichi Aoyagi, Kanagawa-Ken (JP); Shinichi Takemura, Kanagawa-Ken (JP)

(73) Assignees: E.I. du Pont de Nemours and Company, Wilmington, DE (US);
Nippon Oil Corporation, Tokyo (JP)

( * ) Notice: Subject to any disclaimer, the term of this patent is extended or adjusted under 35 U.S.C. 154(b) by 557 days.

(21) Appl. No.: 10/519,029

(22) PCT Filed: Dec. 2, 2002

(86) PCT No.: PCT/US02/41652
§ 371 (c)(1),
(2), (4) Date: Dec. 22, 2004

(87) PCT Pub. No.: WO2004/011248
PCT Pub. Date: Feb. 5, 2004

(65) Prior Publication Data
US 2006/0153669 A1    Jul. 13, 2006

Related U.S. Application Data

(60) Provisional application No. 60/399,337, filed on Jul. 29, 2002.

(51) Int. Cl.
B32B 15/04 (2006.01)
(52) U.S. Cl. .................. 428/457; 901/30; 901/27; 74/490.01
(58) Field of Classification Search ............... 901/30, 901/27; 428/457; 74/490.01
See application file for complete search history.

(56) References Cited

U.S. PATENT DOCUMENTS 4,759,964 A * 7/1988 Fischer et al. ............. 428/116

\* cited by examiner

Primary Examiner—Carol Chaney
Assistant Examiner—Elizabeth Robinson

(57) ABSTRACT

A method of transporting precision equipment materials without absorption of thermal energy through the heat sensitive material or device such as flat panel displays. The transfer member has a carbon fiber reinforced composite material body with a layer of metal film on the top and bottom surfaces of the transfer member that provides a reflective surface. Flat panel displays, for example, release radiant thermal energy that is absorbed by the carbon fiber reinforced composite which is detrimental to the flat panel display. The reflective surface created by the metal film prevents the energy absorption by the carbon fiber reinforced composite. A glass fiber and epoxy layer on the metal film surface protects the metal film.

2 Claims, 2 Drawing Sheets

CARBON FIBER COMPOSITE TRANSFER MEMBER WITH REFLECTIVE SURFACES

This application claims the benefit of U.S. Provisional Application No. 60/399,337, filed Jul. 29, 2002.

FIELD OF THE INVENTION

The present invention relates to a transfer member. More particularly, the present invention relates to a carbon fiber composite transfer member with reflective surfaces that is suitable for transferring flat panel displays without energy absorption.

BACKGROUND OF THE INVENTION

The following disclosures may be relevant to various aspects of the present invention and may be briefly summarized as follows:

In U.S. Pat. No. 6,194,081 B1 to Kingston describes a method of preparing a beta titanium-composite laminate for use predominantly in aircraft structures. The beta titanium-composite laminate comprises a first layer of beta titanium alloy having a certain yield strength to modulus of elasticity ratio and adhering a first layer of composite having a certain strength to modulus of elasticity ratio to the layer of beta titanium alloy, thereby forming a beta titanium-composite laminate, where the yield strength to modulus of elasticity ratio of the first layer of beta titanium alloy matches the strength to modulus of elasticity ratio of the first layer of composite such that the first layer of beta titanium alloy will reach its stress limit and the first layer of composite will reach its stress limits at about the same total strain.

In U.S. Pat. No. 5,866,272 to Westre et al. discloses a hybrid laminate and skin panels of hybrid laminate structure that are suitable for a supersonic civilian aircraft. The hybrid laminates include lay-ups of layers of titanium alloy foil and composite plies, that are optimally oriented to counteract forces encountered in use and are bonded to a central core structure, such as titanium alloy honeycomb. The reinforcing fibers of the composite plies are selected from carbon and boron, and the fibers are continuous and parallel oriented within each ply. However, some plies may be oriented at angles to other plies. Nevertheless, in a preferred embodiment of the invention, a substantial majority of, or all of, the fibers of the hybrid laminates are oriented in a common direction. The outer surfaces of the laminates include a layer of titanium foil to protect the underlying composite-containing structure from the environment, and attack by solvents, and the like.

U.S. Pat. No. 4,888,247 to Zweben et al. discloses heat conducting laminates and laminated heat conducting devices, having at least one layer of metal and at least one layer of polymer matrix composite material having low-thermal-expansion reinforcing material distributed throughout and embedded therein. The coefficient of thermal expansion and the thermal conductivity of the laminated heat conducting devices are defined by the metal in combination with the polymer matrix material and low-thermal-expansion reinforcing material in the laminate. The coefficient of thermal expansion and thermal conductivity of a heat conducting device can be controlled by bonding at least one layer of metal to at least one layer of polymer matrix composite material having low-thermal-expansion reinforcing material distributed throughout and embedded therein. In one embodiment, the laminated heat conducting device comprises a plurality of alternating layers of aluminum and epoxy resin having graphite fibers distributed throughout the epoxy resin.

U.S. Pat. No. 3,939,024 to Hoggatt discloses structural reinforced thermoplastic laminates capable of supporting loads in at least two directions and containing by volume about 45% to 65% fiber reinforcement. The laminates can be used with or without metal cladding.

In the manufacturing processes of precision devices, such as flat panel display devices and semiconductors, a transfer member for transferring these components is used. Such a transfer member may be installed in a device such as an industrial robot for moving precision devices. The components are placed or held on the transfer member and moved to the desired location. In flat panel display manufacturing, for example, high temperature displays are transferred between process steps by automatic robotics. These robots have end effectors (e.g. support arms) that lift and provide a resting place for the display panels during their transport. Ceramic and aluminum have historically been used as the end effector material due to their stiffness and purity levels. Recently, CFRP (carbon fiber reinforced plastic) has been introduced as end effectors because of their stiffness, cost and vibration damping properties have been desirable. However, CFRPs are black in color and absorb radiant thermal energy from the display panel during transport which is detrimental to flat panel displays because too much heat transfer can damage the flat panel display or other heat sensitive material. This feature limits the market of CFRP end effectors in flat panel display manufacturing were it is important not to absorb radiant thermal energy.

It is desirable to provide a transfer member (e.g. support arms or end effectors) that prevents energy absorption by the CFRP, such as for flat panel display transport.

SUMMARY OF THE INVENTION

Briefly stated, and in accordance with one aspect of the present invention, there is provided a method for transporting a device that has a surface that absorbs radiant thermal energy which comprises the step of using a transporting member comprising:
a) a body having a carbon-fiber reinforced composite material, said body having a top surface and a bottom surface;
b) a metal film covering the top and bottom surfaces of the composite body, said film forming a reflective surface; and
c) a glass fiber epoxy resin forming a layer on the metal film covering the top surface and the bottom surface of the body.

BRIEF DESCRIPTION OF THE DRAWINGS

The invention will be more fully understood from the following detailed description, taken in connection with the accompanying drawings, in which.

Figure 1:
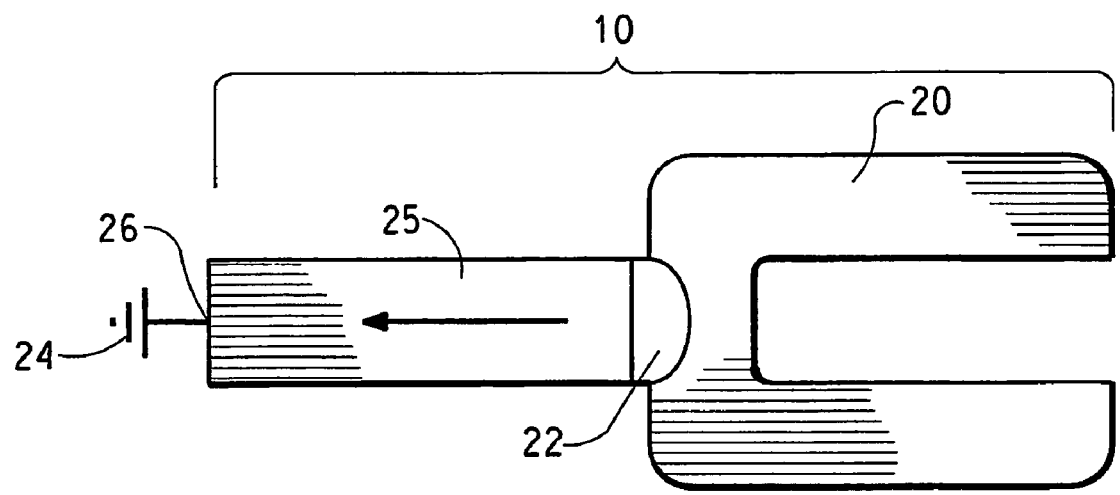
FIG. 1 shows a top view of an end effector or support arm used for transport in the present invention.

While the present invention will be described in connection with a preferred embodiment thereof, it will be understood that it is not intended to limit the invention to that embodiment. On the contrary, it is intended to cover all alternatives, modifications, and equivalents as may be included within the spirit and scope of the invention as defined by the appended claims.

DETAILED DESCRIPTION OF THE INVENTION

The present invention is a transfer member that provides a reflective surface that prevents energy absorption by the carbon fiber-reinforced plastic used in end effectors or support arms to transport precision devices that include flat panel displays and semi-conductors. In high temperature displays precision devices such as flat panel displays and semi-conductors are transferred between process steps by automatic robotics.

The carbon-fiber-reinforced composite material of the transfer member body includes at least one layer of a unidirectional prepreg in which carbon fibers are arranged essentially parallel with the longitudinal direction of the body. The carbon-fiber-reinforced composite material of the body includes at least one layer of a cloth prepreg containing carbon fibers, with at least part of the carbon fibers of the prepreg and the electroconductive polymer part being electrically connected. In the present invention, each layer of the composite body preferably ranges from about 0.02 mm to about 1.00 mm in thickness.

The carbon-fiber-reinforced composite material of the transfer member includes: a carbon-fiber-reinforced plastic (CFRP) and a carbon-fiber-reinforced carbon composite material (C/C composite material). The CFRP material is preferred. The matrix material of the carbon-fiber-reinforced composite material comprises: a thermosetting polymer, a thermoplastic polymer, carbon, ceramic, metal, and mixtures thereof. In the present invention, a thermosetting polymer, carbon, or a mixture thereof is preferable as the matrix. A thermosetting polymer includes: an epoxy, aramid, bismaleimide, phenol, furan, urea, unsaturated polyester, epoxy acrylate, diallyl phthalate, vinyl ester, thermosetting polyimide, melamine, and other such materials.

The thermoplastic polymer matrix material for the present invention includes: polyimide resin, nylon, liquid aromatic polyamide, polyester, liquid aromatic polyester, polypropylene, polyether sulfone polymer, polyphenylene sulfide, PEEK (polyether ether ketone), PEK (polyetherketone) PEKK (polyether ketone), LCP (liquid crystal polymer), polysulfone, polyvinyl chloride, vinylon, aramid, fluoropolymer, and other such materials. The ceramic matrix material for the present invention includes: alumina, silica, titanium carbide, silicon carbide, boron nitride, silicon nitride, and other such materials. Metal matrix materials for the present invention include: titanium, aluminum, tin, silicon, copper, iron, magnesium, chromium, nickel, molybdenum, tungsten, and alloys containing one or more of these metals.

The carbon fibers included in the above-mentioned carbon-fiber-reinforced composite material comprise: petroleum pitch-type carbon fibers, coal pitch-type carbon fibers, polyacrylonitride (PAN) carbon fibers, and other such fibers. The electric resistivity of the carbon fibers is normally from 1-30 $\mu\Omega\cdot m$, and preferably 1-20 $\mu\Omega\cdot m$. The carbon-fiber-reinforced composite material may include only one kind of carbon fibers and can also include a hybrid structure of two or more kinds of these carbon fibers.

The form of the carbon fibers used in the carbon-fiber-reinforced composite material include one-dimensional reinforcing, two-dimensional reinforcing, three-dimensional reinforcing, random reinforcing, and similar forms are appropriately selected and adopted in accordance with the desired purpose of the transfer member. For example, the carbon fibers may be in the form of short fibers, woven fabric, non-woven fabric, unidirectional material, two-dimensional woven fabric, and three-dimensional woven fabric as desired. More specifically, the carbon fibers may be used in a material with the structure of felt, mat, braided fabric (i.e. nonwoven fabric comprising carbon fibers arranged in parallel crosses or triangular form with hot-melt polymer), unidirectional material, pseudo-isotropic material, plain fabric, satin, twilled fabric, pseudo thin fabric, entangled fabric, etc., laminated and then can be installed in the above-mentioned carbon-fiber-reinforced composite material.

The electroconductive polymer part is electrically connected to at least part of the carbon fibers in the body. The body makes contact with the article when the article is transferred. A portion of the electroconductive polymer part is in contact with the transferred article placed thereon. The contact, between the article and the body, is electrically connected to the electroconductive polymer part via the carbon fibers. The present invention further provides contact to a grounding conductor.

The electroconductive polymer part includes a polyimide polymer. In the present invention, the polymer material has electrical conductivity. For example, a polymer material in which an electroconductive filler is added to a thermosetting or thermoplastic polymer. Other materials for the above-mentioned polymer material include: a fluoropolymer, PAI (polyamideimide), PA (polyamide), PEI (polyetherimide), POM (polyoxymethylene), PEEK (polyetheretherketone, PEKK (polyetherketoneketone), PEK (polyetherketone), polyacetate, nylon polymer, aromatic polyimide, polyethersulfon (PES), polyimide, polyetherimide, polyester, liquid crystal polymer (LCP), polybenzimidazole (PBI), Poly(paraphenylene benzobisaxazole) (PBO), polyphenylene sulfide (PPS), polycarbonate (PC), polyacrylate, polyacetal, or mixture of two or more thereof. Other electroconductive fillers for use in the present invention include: metal powders, carbon black, carbon fibers, zinc oxide titanium oxide, potassium titanate. It is preferable, that the polymer material contain a polyimide that has excellent abrasive resistance, antistatic property and chemical resistance; has dimensional stability and mechanical processability for manufacturing a transfer member; and does not easily damage articles such as glass substrates or wafers when making contact with them; and does not easily generate particles.

In the present invention, the volume resistivity of the electroconductive polymer part normally ranges from $10^1$-$10^{12}$ $\Omega\cdot cm$, and preferably from $10^4$-$10^5$ $\Omega\cdot cm$. Additionally, a manufacturing method for making the transfer member may include preparing a transfer member body containing a carbon-fiber-reinforced composite material. The process exposes a portion of the carbon fibers of the composite material, and an electroconductive polymer part is installed on the transfer member body such that it can be electrically connected to the exposed carbon fibers. The electroconductive polymer part is installed by bonding the transfer member body and the electroconductive polymer part with an electroconductive adhesive. The manufacturing method for installation of the electroconductive polymer part comprises inserting the electroconductive polymer part into a hole or concave part. The hole and concave part are formed in a way to expose the internal carbon fibers of the composite material. Another aspect of the present invention is the method of manufacturing a transfer member with electric conductivity. A method for manufacturing the carbon-fiber-reinforced composite material such as CFRP and C/C composite material known in the art can be used. For example, the CFRP can be prepared by forming a prepreg by impregnating reinforcing carbon fibers with a thermosetting polymer, then laminating and curing them. However, it is preferable to obtain the CFRP with a prescribed elastic modulus by laminating the prepreg of unidirectional reinforcing carbon fibers, that is, unidirectional prepreg so that the direction of the fibers is 0° and 90°, 0°, ±45°, and 90° or 0°, ±60°, and 90° with respect to the longitudinal direction of the transfer part.

In the impregnation of the reinforcing carbon fibers into the thermosetting polymer, a hot-melt method, that usually heats the polymer to 60-90° C. and impregnates it on the reinforcing fibers, is preferably applied. The content of the thermosetting polymer in the prepreg manufacture is usually 20-50 wt %, and preferably 25-45 wt %, relative to the total weight of the reinforcing fibers.

If necessary, a filler can be added to the polymer constituting the prepreg. The filler material includes: mica, alumina, talc, fine powder-shaped silica, wollastonite, sepiolite, basic magnesium sulfate, calcium carbonate, polytetrafluoroethylene powder, zinc powder, aluminum powder, and organic fine particles such as fine acryl particles, fine epoxy polymer particles, fine polyamide particles, and fine polyurethane particles and other such materials or a combination of two or more of any of the above. The prepreg is laminated in an appropriate shape on the transfer part and heated and cured at 110-150° C. for 30 min-3 hr in an autoclave or by a press, so that the CFRP can be obtained. With such a method, CFRP with stable qualities and little voids can be obtained.

The C/C composite material can also be manufactured by a known method. For example, carbon fibers are used in a form similar to the carbon fibers used for the CFRP manufacture described above. A preform (i.e. a shape formed at an intermediate step of the process) is formed by impregnating the preform into a matrix polymer such as a thermoplastic polymer and thermosetting polymer, then carbonized by a hot isostatic process (i.e. HIP) treatment or similar method so that the carbonized matrix can be formed on the carbon fibers. Carbonization can be carried out by heating the preform as described above at 500° C., preferably, 300° C., in an inert gas.

The C/C composite includes a pitch substance such as those using coal pitch, petroleum pitch, synthetic pitch, isotropic pitch, and meso-phase pitch as raw materials. Also a thermoplastic polymer that may include: polyimide resin, phenol polymer, epoxy polymer, furan polymer and urea polymer and a thermosetting polymer comprises phenol polymer, epoxy polymer, furan polymer, urea polymer and other such materials.

The pitch, thermosetting polymer, or thermoplastic polymer can also be mixed with a filler and provided to the process for forming the matrix. Examples of filler material include: carbon powders, graphite powders, silicon carbide powders, silica powders, carbon fiber whiskers, carbon short fibers, and silicon carbon short fibers.

Another example of the method for manufacturing the C/C composite material, is forming a matrix by attaching a thermally decomposable carbon to carbon fibers using chemical vapor deposition (CVD), chemical vapor infiltration (CVI), or such similar process creating the C/C composite material can be prepared. The C/C composite material obtained in this manner can be further subjected to a miniaturization treatment. In particular, the density of the composite material can be improved by repeating the matrix forming process.

The body of the transfer member of the present invention may be formed from just the carbon-fiber-reinforced composite material or, from the combination of the carbon-fiber-reinforced composite fiber and other materials such as a glass fiber reinforced plastic (GFRP). The other materials include structures such as a honeycomb, a porous body, or a corrugated plate.

The body can be prepared by subjecting the molded body, containing the carbon-fiber-reinforced composite material obtained using the method described above, to a process such as cutting the body to the desired shape. With such processing, the body having the desired form can be obtained with accurate working precision. Furthermore, an electrical connection of the carbon fibers and the electroconductive polymer part can be easily achieved as will be described subsequently. And, if necessary, the body can have coating agents applied to prevent particle generation from the working surface. A thermosetting polymer such as an epoxy polymer and silicone wax can be used as the coating agent.

An example of the transfer member body of the present invention is an oblong plate-shaped structure with skin layers positioned on both surfaces of the plate and a core layer positioned between the skin layers. The top and bottom surfaces of the structure are covered with an epoxy coated, metal film forming a reflective surface. As mentioned above, each skin layer of the transfer member body preferably ranges from about 0.02 mm to about 1.00 mm in thickness. The skin layers have a first carbon-fiber-reinforced composite material layer containing carbon fibers, that are oriented at an angle of −20° to +20° with respect to the longitudinal direction of the transfer part and have a tensile elastic modulus of 500-1,000 GPa. The second layer is a carbon-fiber-reinforced composite material layer containing carbon fibers, that are oriented at an angle of +75° to +90° and/or −75° to −90° with respect to the longitudinal direction of the transfer part and have a tensile elastic modulus of 200-400 GPa. The skin layers have a third carbon-fiber reinforced composite fiber that is oriented at an angle of +30° to +60° and/or −30° to −60° with respect to the longitudinal direction of the transfer part and has a tensile elastic modulus of 500-1,000 GPa. The ratio of the thickness of the three skin layers to the total thickness of the skin layers and the core layer is 20-80%, preferably 60-80%. The contact can be electrically connected to the polymer electroconductive part via carbon fibers of the skin layers. Also the core layer, in addition to or instead of, the above-mentioned third skin layer of carbon-fiber-reinforced composite material, may include another material layer with a structure such as a honeycomb, porous body, and/or a waved plate (corrugated) and voids may also be used. A cloth layer made of fibrous materials such as carbon fibers, can be disposed on the outermost surface of the body making it easier to process the transfer members than if the cloth layer was not present. And, if the cloth layers are made of carbon fiber, the electronic connection between the contact and electroconductive polymer part becomes easier.

An embodiment of the transfer member of the present invention includes a body having a carbon-fiber-reinforced composite material and an electroconductive polymer part being electrically connected to at least part of the carbon fibers in the body and having a portion for contact with a transferred article by placing it on the body. The area where the transfer member makes contact with the article may be the surface of the distal end of the transfer member, and the electroconductive polymer part.

Figure 4:
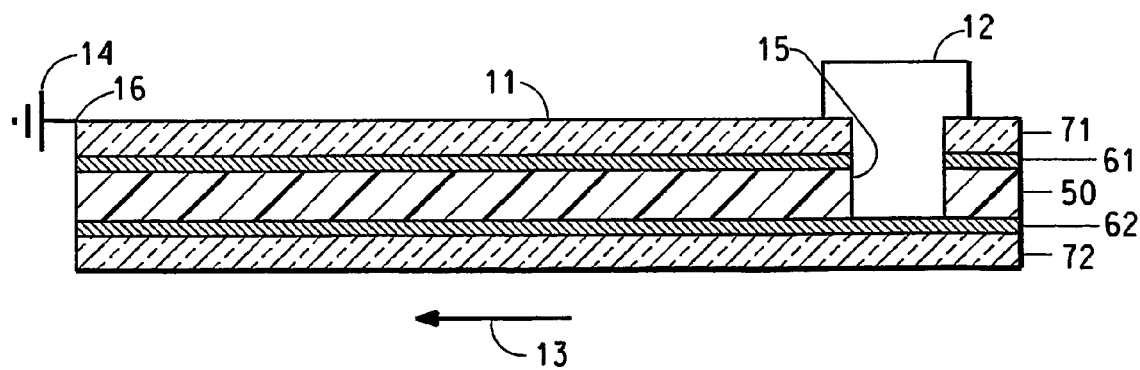
FIG. 4 shows a cross-sectional view of the transfer member (i.e. end effector, support arm, body) is cut by a vertical section, including its longitudinal direction.

The electrical connection of the electroconductive polymer part with at least part of the carbon fibers of the body can be achieved by: exposing a portion of the carbon fibers of the carbon-fiber-reinforced composite material contained in the body, and installing the electroconductive polymer part on the body so that it can be electrically connected with the carbon fibers exposed. The carbon fibers may be exposed by forming the transfer member body as a molded body containing the carbon-fiber-reinforced composite material and forming a hole or concave part by cutting a portion thereof. (e.g. Normally, when a molded body containing a carbon-fiber-reinforced composite material is manufactured, its surface is coated with a matrix, and the carbon fibers are not exposed. Thus, if a portion of the body is cut, the carbon fibers are exposed.) In addition to the carbon fiber layer, the metal and the glass fiber epoxy layer as shown in FIG. 4 would also have to be similarly cut and exposed. The glass fiber epoxy resin layer comprises a combination of glass fiber material and epoxy resin material. The glass fiber material includes S-glass, E-glass, and D-glass and examples of epoxy resin materials include condensation products of epichlorohydrin and bisphenol-A.

The electrical connection of the exposed carbon fibers and the electroconductive polymer part may occur by bonding the body and the electroconductive polymer part with an electroconductive adhesive at a different portion of the electroconductive polymer part then the portion for contact with a transferred article on the surface of the body containing the cut surface or by inserting the electroconductive polymer part into the hole or concave part formed in the process for exposing the carbon fibers of the body. However, a method for bonding the body and the electroconductive polymer part is not critical, any method in which the electroconductive polymer part can be electrically connected with at least part of the carbon fiber forming the body and another portion where a transferred article may be placed in contact therewith may be used.

The transfer part of the present invention may be equipped with only one electroconductive polymer part or with several electroconductive polymer parts. When several electroconductive polymer parts are used, one or more of them can be electrically connected to the carbon fibers.

The transfer part of the present invention can be further equipped with a contact to a grounding conductor. The above-mentioned contact is electrically connected with the electroconductive polymer part via at least part of the carbon fibers, so that the static electricity of an article making contact with the electroconductive polymer part can be removed by the grounding method. The above-mentioned contact may be simply that of the exposed surface of the carbon fibers formed by cutting of the body or it may also be a desired metal electrode.

The shape of the transfer part of the present invention can be oblong as mentioned above, however, a variety of shapes including a plate shape, rod shape, fork shape, honeycomb shape, hollow rod shape, T shape, I shape, curved surface shape, or a combined shape can also be adopted for use in the present invention. Typically, the transfer member of the present invention can have an area in contact with the transferred article at its distal end or can have the contact at its proximal end. The transfer member of the present invention may have a shape in which only the electroconductive polymer part makes contact with the transferred article and supports it or, a shape in which both the electroconductive polymer part and the body make contact with the transferred article and support it. The proximal end is fixed to a device for moving the transfer member such as an industrial robot. The device is operated such that the article being transferred may be placed or held at the distal end to enable transfer of the article.

Figure 2:
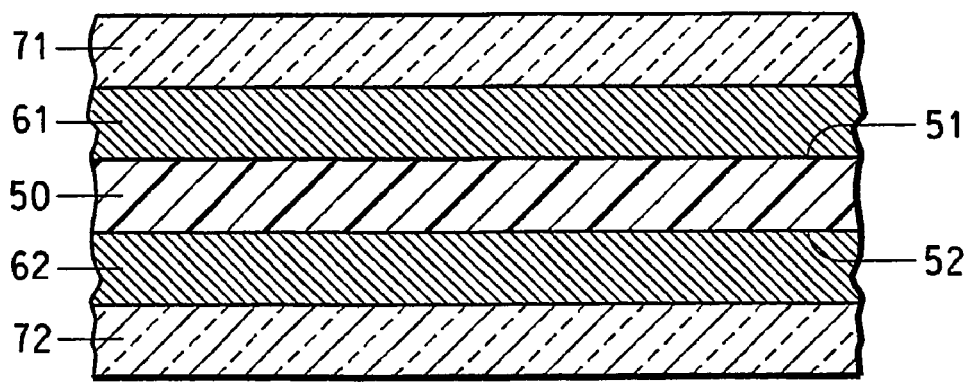
FIG. 2 shows cross-sectional view of the layers of the transfer member in the present invention.

Reference is now made to the drawings for a detailed description of the present invention. Examples of the transfer member of the present invention are explained below in reference to the Figures. Reference is now made to the drawings for a detailed description of the present invention. FIG. 1 shows a topical view of an embodiment of the present invention where an end effector or support arm or body 10 has a fork-shaped structure. The body 10 has a portion 20 of the transfer member that holds the article (e.g. precision device) being transferred. The handle portion 25 is attached to the article holding portion 20. The body 10 is formed from a core material such as a carbon fiber composite material and then additional layers as described in FIG. 2.

In the body 10, part or all of the carbon fibers are arranged essentially parallel with the longitudinal direction, that is, the distal position-proximal position direction of the body 10. An electroconductive polymer part 22 is mounted at a position shown in FIG. 1, so that it is electrically connected to a contact 26 via the carbon fibers. The grounding conductor 24 is connected to the contact 26 in removing the current (i.e discharging the static electricity).

The body of the present invention is made up of layers shown in the cross-sectional view of a portion of the body. The body 10 (see FIG. 1) is composed of layers that include: a carbon fiber composite layer 50 that has a top surface 51 and a bottom surface 52. A metal film 61, 62 is applied to the top surface 51 and the bottom surface 52, respectively, of the carbon-fiber reinforced plastic material 50. The metal film 61, 62 includes at least one of the following: titanium, copper, aluminum, steel, gold, silver, nickel, tin, and/or combinations thereof. This metal film 61, 62 provides the reflective surface that prevents energy absorption by the CFRP during transport in the present invention. This is particularly useful for the transport of precision devices such as flat panel displays and other such devices in which energy absorption by the transport material can occur. This metal film 61, 62 is preferably titanium.

A glass fiber epoxy resin layer 71, 72 is applied to the metal film 61 (top surface layer) and 62 (bottom surface layer), respectively. (The glass fiber expoxy resin layers 71, 72 are applied to opposite sides of the metal film 61 and 62 than those sides in contact with the carbon-fiber reinforced plastic material 50.) The translucent layer of the glass fiber and epoxy layer provide see through and protective fiber for the metal film. The composite layers shown in FIG. 2 of the present invention will not absorb thermal energy and can be utilized as end effectors in the transport of temperature sensitive flat panel displays. The carbon-fiber-reinforced composite layer of the body includes a non purity of less than 30 ppm, preferably less than 15 ppm water and less than 5 ppm, preferably less than 1 ppm hydrogen gas being evolved at a vacuum of 10-5 Pa, having a temperature condition of from 25° C. to 250° C. at a ramp up rate of 10° C./minute.

Figure 3:
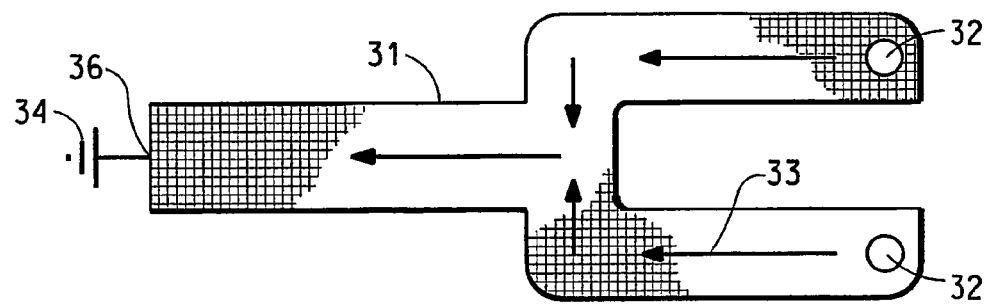
FIG. 3 shows a top view showing another example of the transfer member.

Reference is now made to FIG. 3, which shows a top view of another embodiment of the transfer member of the present invention. A body 31 has a fork-shaped structure, and an electroconductive polymer part 32 is mounted in each of its branched ends. The body 31 is formed by laminating cloth prepreg sheets. In the body 31, carbon fibers in the cloth prepregs are crossed and extended in the longitudinal direction and the width direction of the transfer member body 31. Therefore, the electroconductive polymer part 32 is electrically connected to a contact 36 via said carbon fibers, and in transferring an article, the article makes contact with the electroconductive polymer part 32, so that a current flows in the arrow direction 33, thereby removing the current (i.e. discharging the static electricity). The grounding conductor 34 is connected to the contact 36 in a similar manner as described in FIG. 1.

FIG. 4 is a cross section in which the transfer member is cut by a vertical section, including its longitudinal direction. The body 11 has an oblong plate shape, and is formed of a carbon-fiber-reinforced composite material, and has a concave part 15 on the upper surface of its distal end. The concave part 15 is produced by forming a molded body composed of a carbon-fiber-reinforced composite material and cuffing it in the shape shown. An electroconductive polymer part 12 has a convex part fitting into the concave part 15 and is mounted in the body 11 via an electroconductive adhesive or by press-fitting it into the concave part 15. At the proximal end of the body 11, a contact 16 to a grounding conductor 14 is installed and connected to the grounding conductor 14. In actual use, the contact 16 may be directly connected to the grounding conductor 14 or may also be grounded via a device such as an industrial robot for moving the transfer member. The contact 16 can also have a structure fitted to each ground shape. The body 11 is formed by laminating unidirectional prepreg sheets. In the body 11, part or all of the carbon fibers of composite layer 50 are arranged substantially parallel with the longitudinal direction of the body 11, that is, in the distal position to proximal position direction. Thus, the electroconductive polymer part 12 and the contact 16 are electrically connected via the carbon fibers of the body 11, and in transferring an article, the article makes contact with the electroconductive polymer part 12, so that a current flows in the arrow 13 direction, thereby removing the current.

The transfer member of the present invention comprises a body comprising a carbon-fiber-reinforced composite material and an electroconductive polymer part being electrically connected to at least part of the carbon fibers in said body and having a portion for contact with a transferred article by it being placed on, can improve transferability of a transferred article such as silicon wafer for semiconductor and liquid crystal glass substrate by a transfer member, suppress damage to the transferred articles caused by a transferring environment and be easily manufactured, and has lightness, high stiffness, and high heat resistance due to the body containing a fiber reinforced composite material and the electroconductive polymer part associated with the body, in addition, can effectively remove the static electricity of an article by the grounding method. Therefore, components such as large-scale glass substrates, flat panel displays and wafers, which require an accurate operation, can be favorably transferred without lowering their qualities and yield. Thus, the transfer part is very useful in a similar manner as described in FIG. 1.

In transferring an article, the article makes contact with the electroconductive polymer part 32, so that a current flows in the arrow direction 33. Also, in the method for manufacturing the transfer member of the present invention, the above-mentioned transfer part can be manufactured in a simple manner.

It is therefore, apparent that there has been provided in accordance with the present invention, a transfer member with reflective surfaces that fully satisfies the aims and advantages hereinbefore set forth. While this invention has been described in conjunction with a specific embodiment thereof, it is evident that many alternatives, modifications, and variations will be apparent to those skilled in the art. Accordingly, it is intended to embrace all such alternatives, modifications and variations that fall within the spirit and broad scope of the appended claims.

What is claimed is:

1. A method of transporting a device wherein said method prevents radiant thermal energy absorption by a surface of said device, said method comprising transporting said device using a transfer member comprising;
    a) a body having a carbon-fiber reinforced composite material, said body having a top surface and a bottom surface;
    b) metal films covering the top and bottom surfaces of the carbon-fiber reinforced composite body, said films forming reflective surfaces;
    c) glass fiber epoxy resin layers covering the sides of the metal films opposite the sides in contact with the carbon-fiber reinforced composite material; and
    d) at least one electroconductive polymer part, wherein said at least one electroconductive polymer part is bonded to said body of step a) and electrically connected to exposed carbon fibers of said carbon-fiber reinforced composite material of said body of step a) and wherein a portion of said at least one electroconductive polymer part is in contact with said device.

2. The method of claim 1 wherein said device is a flat panel display.

* * * * *